United States Patent
Wang et al.

(10) Patent No.: US 8,288,204 B1
(45) Date of Patent: Oct. 16, 2012

(54) METHODS FOR FABRICATING COMPONENTS WITH PRECISE DIMENSION CONTROL

(75) Inventors: Lei Wang, Fremont, CA (US); Zongrong Liu, Pleasanton, CA (US)

(73) Assignee: Western Digital (Fremont), LLC, Fremont, CA (US)

(*) Notice: Subject to any disclaimer, the term of this patent is extended or adjusted under 35 U.S.C. 154(b) by 0 days.

(21) Appl. No.: 13/221,769

(22) Filed: Aug. 30, 2011

(51) Int. Cl.
*H01L 21/44* (2006.01)

(52) U.S. Cl. ........ 438/107; 438/459; 438/584; 438/770; 257/E21.283

(58) Field of Classification Search .................. 438/107, 438/459, 584, 770
See application file for complete search history.

(56) References Cited

U.S. PATENT DOCUMENTS

| | | | |
|---|---|---|---|
| 5,687,267 A | 11/1997 | Uchida | |
| 5,907,571 A | 5/1999 | Ogino et al. | |
| 6,164,837 A | 12/2000 | Haake et al. | |
| 6,485,198 B1 | 11/2002 | Chang et al. | |
| 6,534,794 B1 | 3/2003 | Nakanishi et al. | |
| 6,577,656 B2 | 6/2003 | Chen et al. | |
| 6,627,096 B2 | 9/2003 | Sherrer et al. | |
| 6,804,276 B2 | 10/2004 | Gen-ei et al. | |
| 6,811,853 B1 | 11/2004 | Sherrer et al. | |
| 6,858,871 B2 | 2/2005 | Okada | |
| 6,960,485 B2 | 11/2005 | Uemura et al. | |
| 7,217,955 B2 | 5/2007 | Hamaoka et al. | |
| 7,371,017 B1 | 5/2008 | Shi et al. | |
| 7,449,905 B2 | 11/2008 | Shi et al. | |
| 7,502,397 B2 | 3/2009 | Naganuma | |
| 7,522,649 B2 | 4/2009 | Ha et al. | |
| 7,608,863 B2 | 10/2009 | Oda et al. | |
| 7,613,080 B2 | 11/2009 | Oozeki et al. | |
| 7,638,439 B2 * | 12/2009 | Kubota et al. ................. | 438/770 |
| 7,687,810 B2 | 3/2010 | Mo et al. | |
| 7,739,703 B2 | 6/2010 | Arai et al. | |
| 2002/0089913 A1 | 7/2002 | Moriyama et al. | |
| 2002/0163865 A1 | 11/2002 | Zimmer et al. | |
| 2003/0002549 A1 | 1/2003 | Oh | |
| 2004/0231997 A1* | 11/2004 | Wang et al. ................... | 205/143 |
| 2007/0015313 A1 | 1/2007 | Kwak et al. | |
| 2008/0056073 A1 | 3/2008 | Shimizu | |
| 2008/0316872 A1 | 12/2008 | Shimizu et al. | |
| 2009/0035885 A1 | 2/2009 | Karlicek, Jr. et al. | |
| 2009/0207580 A1 | 8/2009 | Oshika et al. | |
| 2009/0219728 A1 | 9/2009 | Hata et al. | |
| 2010/0109030 A1 | 5/2010 | Krames et al. | |
| 2010/0238581 A1 | 9/2010 | Nakamura et al. | |
| 2011/0108896 A1* | 5/2011 | Feng et al. ..................... | 257/288 |
| 2011/0265867 A1* | 11/2011 | Moslehi ......................... | 136/255 |

* cited by examiner

*Primary Examiner* — Alexander Ghyka

(57) ABSTRACT

Methods for fabricating components with precise dimension control are described. One such method includes providing a workpiece including a top layer and a bottom layer of silicon separated by a layer of SiOx, where each of the three layers has about the same length and width, removing edge portions of the top layer, thereby exposing portions of the SiOx layer, etching the exposed portions of the SiOx layer and portions of the SiOx layer disposed between the top layer and bottom layer, thereby forming undercut sections between the top layer and bottom layer, growing a second layer of SiOx having a preselected thickness on the workpiece, depositing metal on the workpiece such that the metal deposited on the top layer is not continuous with the metal deposited on the bottom layer, and removing the bottom layer and a portion of the SiOx layer having a preselected thickness.

21 Claims, 4 Drawing Sheets

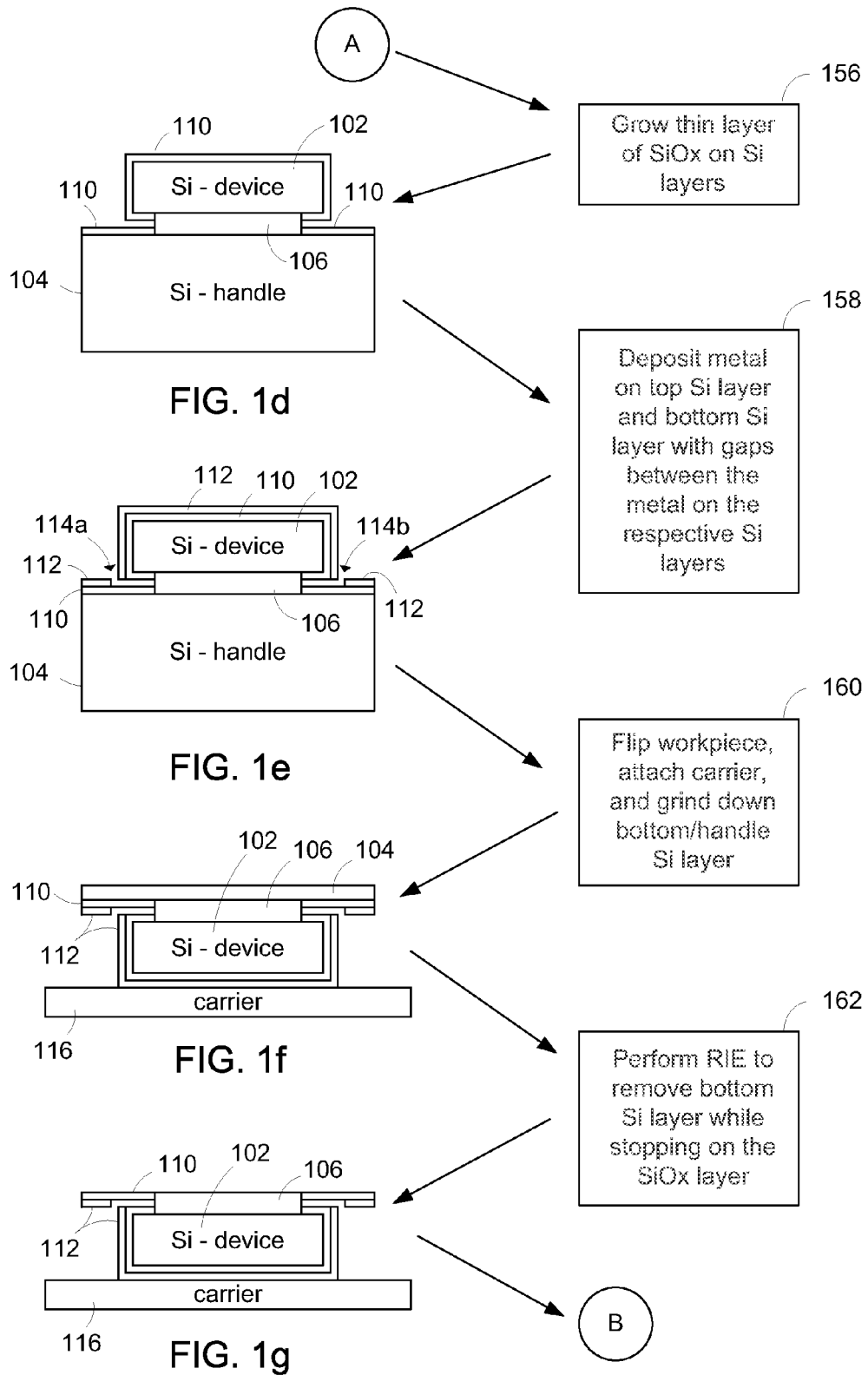

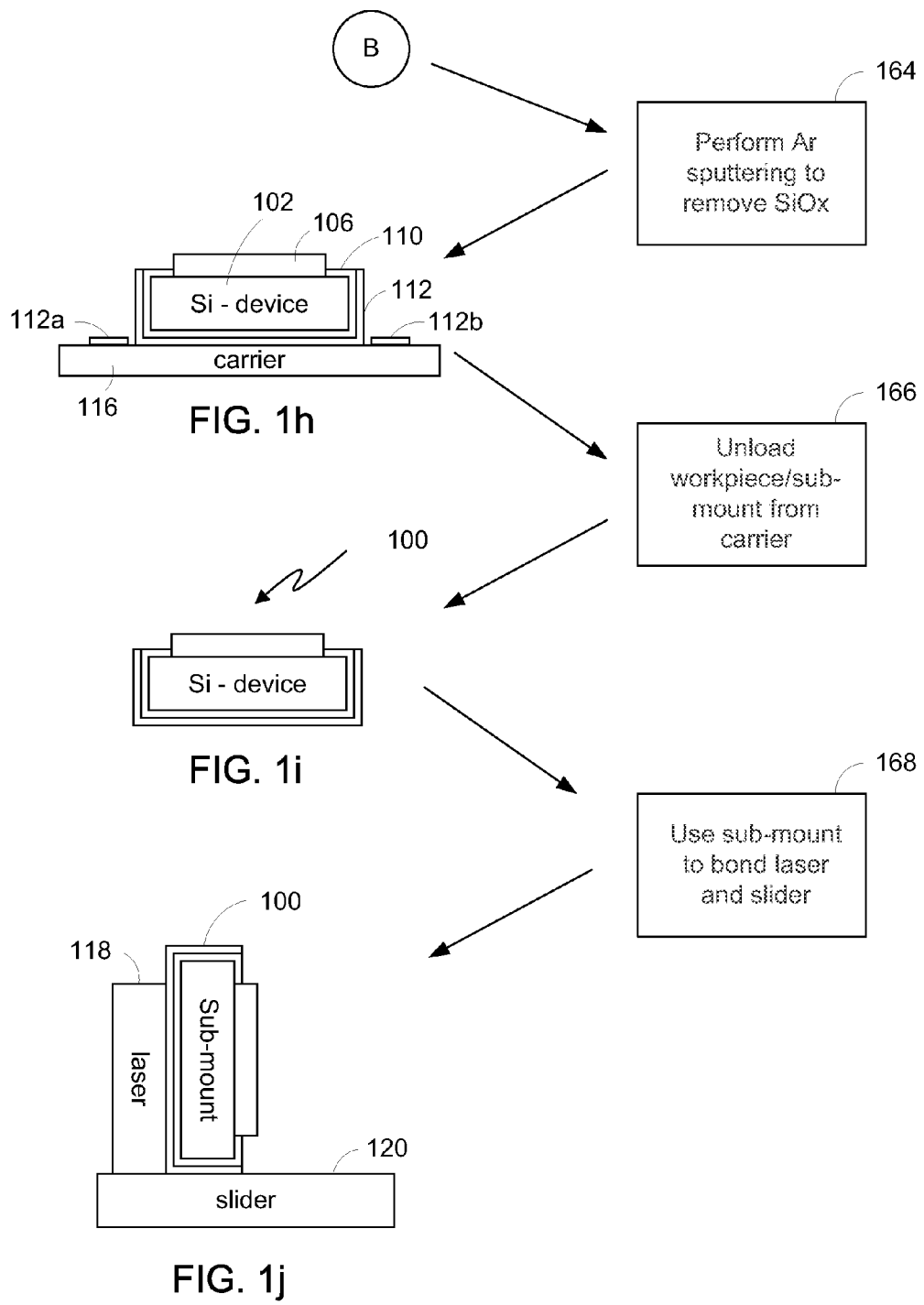

US 8,288,204 B1

METHODS FOR FABRICATING COMPONENTS WITH PRECISE DIMENSION CONTROL

FIELD

The present invention relates to fabricating components, and more specifically to methods for fabricating components with precise dimension control.

BACKGROUND

Conventional energy assisted magnetic recording (EAMR) disk drives generally include an EAMR assembly with a conventional laser diode (e.g., laser) mounted to a sub-mount which is attached to a slider that can be suspended over a recording media disk. The sub-mount is helpful to dissipate excess thermal energy from the laser and to provide connectivity for electrical signals to the laser.

The sub-mount or heat sink for the laser diode is typically made by lapping and dicing ceramic materials, such as SiC and AN. However, the resulting variations in the dimensions of the product using these techniques are in the tens of micrometers. Variations of this scale can be too high for some applications, including, for example, an EAMR application where tight tolerances may be required. As such, a need exists for improved methods for fabricating components with precise dimension control.

SUMMARY

Aspects of the invention relate to methods for fabricating components with precise dimension control. In one embodiment, the invention relates to a method for fabricating silicon components with precise dimension control, the process including providing a workpiece including a top layer of silicon and a bottom layer of silicon separated by a first layer of SiOx, where each of the three layers has about a same length and a same width, removing edge portions of the top layer, thereby exposing portions of the first layer of SiOx, etching the exposed portions of the first SiOx layer and portions of the first SiOx layer disposed between the top layer and the bottom layer, thereby forming undercut sections between the top layer and the bottom layer, growing a second layer of SiOx having a preselected thickness on the workpiece, depositing a metal on the workpiece such that the metal deposited on the top layer is not continuous with the metal deposited on the bottom layer, and removing the bottom layer and a portion of the first layer of SiOx having a preselected thickness.

In one embodiment, the removing the bottom layer and the portion of the first layer of SiOx further includes attaching the top layer to a carrier substrate, removing the bottom layer and the portion of the first layer of SiOx having the preselected thickness, and removing the carrier substrate.

BRIEF DESCRIPTION OF THE DRAWINGS

FIGS. 1a-1j show a sequence of perspective and side views of a silicon on insulator workpiece and corresponding processing actions illustrating a process for forming a sub-mount assembly having precisely controlled dimensions in accordance with one embodiment of the invention.

DETAILED DESCRIPTION

Figure 1A:
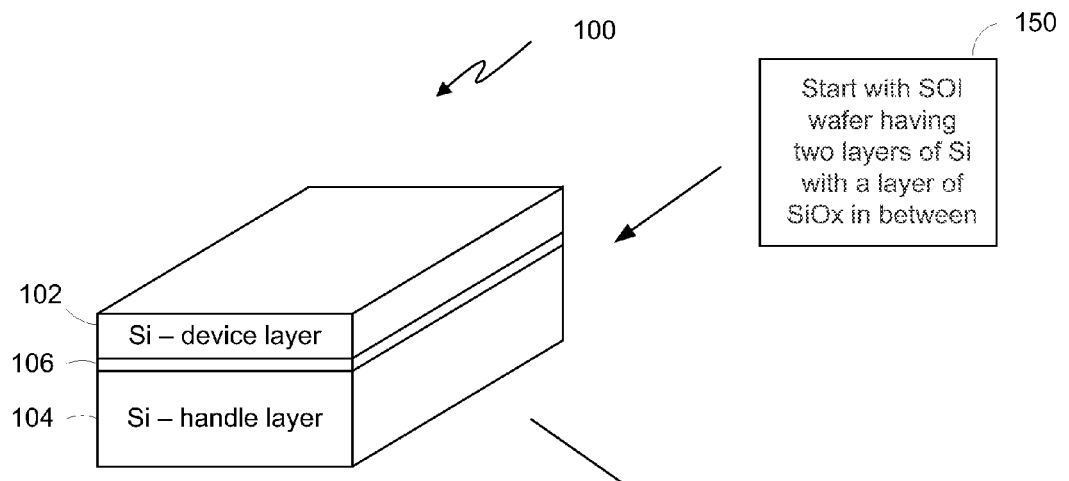

Referring now to the drawings, embodiments of processes for fabricating components with precise dimension control are illustrated. These fabrication processes provide a silicon on insulator (SOI) substrate or workpiece including top and bottom silicon layers separated by a buried oxide layer of SiOx, remove edge portions of the top layer thereby exposing portions of the SiOx, and etch the exposed portions of the SiOx and small portions of the SiOx between the top and bottom layers, thereby forming undercut sections between the top and bottom layers. The processes also grow a second layer of SiOx on the workpiece, and deposit metal on the workpiece where the undercut sections help to ensure that the metal deposited on the top layer is not continuous with the metal deposited on the bottom layer. The non-continuous deposited metal can ensure a relatively easy release of the bottom layer component during subsequent processing.

In several embodiments, the undercut sections and the corresponding non-continuous metal layer areas can eliminate use of ion milling to release the bottom layer component by breaking up the metal layer during the subsequent processing of the workpiece. The fabrication processes can ultimately remove the bottom layer and a preselected portion of the original SiOx layer. The resulting workpiece component can have very precise dimensions, including, for example, the thicknesses of the remaining workpiece layers such as the Si layer, SiOx layers, and the metal layer. The resulting component can be use as a sub-mount for coupling a laser and a slider in a disk drive.

FIGS. 1a-1j show a sequence of perspective and side views of a silicon on insulator (SOI) workpiece 100 and corresponding processing actions illustrating a process for forming a sub-mount assembly having precisely controlled dimensions in accordance with one embodiment of the invention. FIG. 1a is a perspective view of the silicon on insulator (SOI) workpiece 100 in accordance with one embodiment of the invention. FIGS. 1b-1j are side views of the silicon on insulator (SOI) workpiece 100 and the corresponding processing actions illustrating the process for forming the sub-mount assembly having precisely controlled dimensions in accordance with one embodiment of the invention.

As illustrated in FIG. 1a, the process starts (150) with providing the SOI workpiece/wafer 100 which includes a silicon device/top layer 102 and a silicon handle/bottom layer 104 separated by a SiOx buried oxide layer 106. The three layers (102, 104, 106) each have a rectangular block shape having about the same length and width, for example, taken across the top surface of the top layer 102. The thicknesses of the rectangular block shaped layers (102, 104, 106) can be different. For example, in one embodiment, the top layer has a thickness of about 200 microns, the SiOx layer 106 has a thickness of about 2 microns, and the bottom layer 104 has a thickness of about 450 microns. In other embodiments, the layers can have other suitable thicknesses.

Figure 1B:
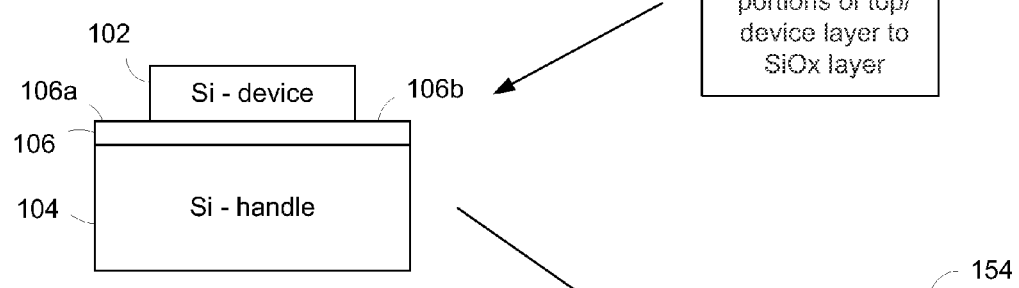

As illustrated in FIG. 1b, the process performs deep reactive ion etching or RIE (152) on edge portions of the top layer 102 to the SiOx layer 106. The deep reactive ion etching can remove the edge portions while stopping on the SiOx layer 106 and thereby leaving exposed areas (106a, 106b) of the SiOx layer 106. In some embodiments, the deep reactive ion etching may inadvertently remove small portions of the top layer 102 around the area where the side edge of the top layer 102 and SiOx layer 106 meet. The edge portions etched from the top layer 102 using the DRIE can include edge sections of the top layer 102 at each of the four sides of the top surface of the top layer 102. In several embodiments, the four sides of the top surface of the top layer 102 are etched such that about 5 to 10 percent of the length and the width of the top surface are removed. In another embodiment, three of the sides are etched about 5 to 10 percent while the last side is etched about 15 to 30 percent.

Figure 1C:
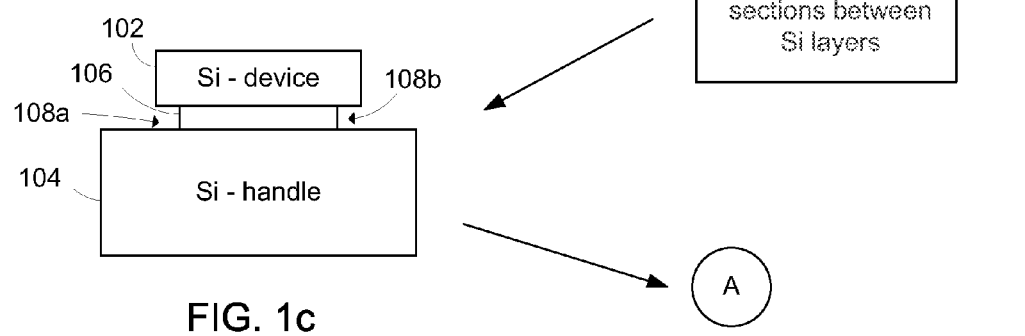

As illustrated in FIG. 1c, the process performs hydrofluoric (HF) acid etching (154) of the SiOx layer 106, thereby forming undercut sections (108a, 108b) between the top 102 and bottom 104 Si layers. In the embodiment illustrated in FIG. 1c, the process performs the etching using hydrofluoric acid. In other embodiments, other suitable acids and/or suitable etching agents can be used. While FIG. 1c illustrates only two side undercut sections (108a, 108b), another two side undercut sections are positioned along the other sides of the rectangular shaped top layer 102. In such case, the undercut sections exist along each of the four sides of the rectangular top layer 102. In one embodiment, the undercut sections (108a, 108b) have a height of about 1-2 microns and a horizontal length of about 7-10 microns. In other embodiments, the undercut sections can have other suitable dimensions.

As illustrated in FIG. 1d, the process grows (156) a thin second layer of SiOx 110 on the top 102 and bottom 104 Si layers. More specifically, and as illustrated in FIG. 1d, the second layer of SiOx 110 is grown on the top and side surfaces of the top layer 102, and on the top surface of the bottom layer 104. In several embodiments, the second layer of SiOx 110 is grown by placing the workpiece into an oven that contains oxygen and heating the workpiece at a preselected temperature (e.g., about 1000 degrees Celsius) for a preselected duration. In other embodiments, other suitable techniques for growing the SiOx can be used, including, for example, other thermal oxidation processes, chemical vapor deposition (CVD), or other such processes known in the art. In several embodiments, a suitable growing process ensures that the SiOx is not grown to be overly thick, and preferably just thick enough to be electrically insulating.

As illustrated in FIG. 1e, the process deposits (158) a metal 112 on the top and side surfaces of the top layer 102 and inadvertently on the bottom layer 104 thereby forming gaps (114a, 114b) between the metal deposited on the top 102 and bottom 104 layers. In several embodiments, the deposition of the metal 112 on the bottom layer 104 is an unintended consequence of the metal deposition on the side surfaces of the top layer 102.

In one embodiment, the metal 112 is deposited using a sputtering process, an evaporation process, and/or another suitable deposition process known in the art. In several embodiments, the metal 112 is deposited at an angle using a full film deposition process, where the angled deposition is particularly direct to the side surfaces of the top layer 102. In one such embodiment, the angle of deposition is about 45 degrees. In other embodiments, other suitable angles of deposition can be used.

In several embodiments, the metal 112 deposition includes a two step deposition process where the first step includes deposition of one or more under bump metal (UBM) materials, and the second step includes deposition of one or more solder materials on the UBM materials. The UBM metal materials can include Au, Ti, Ta, Ni, Pt, Cu, Cr, and/or other UBM materials known in the art. The solder materials can include In, Sn, Ag, and/or other solder materials or solder alloys known in the art.

As illustrated in FIG. 1f, the process flips (160) the workpiece, attaches a carrier 116, and grinds down the bottom/handle layer 104 to a preselected thickness. In several embodiments, the carrier 116 is attached to an outer surface of the metal 112 positioned on the top surface of the top/device layer 102 using an adhesive material. The adhesive material can be an adhesive tape, an adhesive wax, epoxy, another thermosetting polymer and/or another suitable adhesive known in the art. In one embodiment, the carrier is made of stainless steel or another suitable material. In several embodiments, the handle layer 104 is first subjected to coarse grinding (e.g., using a suitable grinding wheel) and subsequently subjected to fine grinding using lapping to ensure removal of the handle layer 104 up to the preselected thickness. In one embodiment, the preselected thickness of the remaining portion is about 10 microns.

As illustrated in FIG. 1g, the process then performs RIE (162) on the handle layer 104 to remove the handle layer 104 while stopping on the SiOx layers (106, 110). In one embodiment, the process performs wet etching instead of the RIE.

As illustrated in FIG. 1h, the process then performs Ar sputtering (164) to remove portions of the SiOx layers (106, 110). In several embodiments, the process removes the portions of the second SiOx layer 110 that were previously in contact with the handle layer 104. In such case, the process also removes a preselected thickness of the first SiOx layer 106, where the preselected thickness of the removed portion is about equal to the thickness of the removed portions of the second SiOx layer 110 that were previously in contact with the handle layer 104. Portions of the metal layer (112a, 112b) that previously were attached to the removed portions of the second SiOx layer 110 are released onto the carrier and can be discarded. Because the gaps (114a, 114b) were formed during the metal deposition (see FIG. 1e), the undesirable metal portions (112a, 112b) are easily released at this stage in the process without requiring additional processing steps such as ion milling or other such processes. In addition, the outer surfaces of the workpiece, including particularly that of the first SiOx layer 106, can have a very smooth finish and the overall workpiece can exhibit precise dimension (e.g., thickness) control as a result of the process.

In the embodiment illustrated in FIG. 1h, the process uses Ar for gas sputtering to remove the SiOx, where the sputtering typically takes place within a reactive ion etching type chamber. In other embodiments, other suitable gases can be used for the gas sputtering. In some embodiments, the process performs wet etching instead of, or in addition to, the Ar sputtering. In several embodiments, the gas sputtering involves use of a light un-collimated Ar sputtering in a RIE type chamber instead of traditional ion milling including a dedicated ion milling chamber and use of a collimated ion beam.

As illustrated in FIG. 1i, the process unloads (166) the workpiece/sub-mount 100 from the carrier 116.

As illustrated in FIG. 1j, the process uses (168) the sub-mount 100 to bond a laser 118 and a slider 120. In several embodiments, the process first attaches the sub-mount 100 to the laser 118 (e.g., by soldering), and then attaches the sub-mount 100 to the slider 120 (e.g., by soldering). In several embodiments, the assembly that includes the sub-mount, laser, and slider is used to form a read/write head for use within a magnetic disk storage device.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 2:
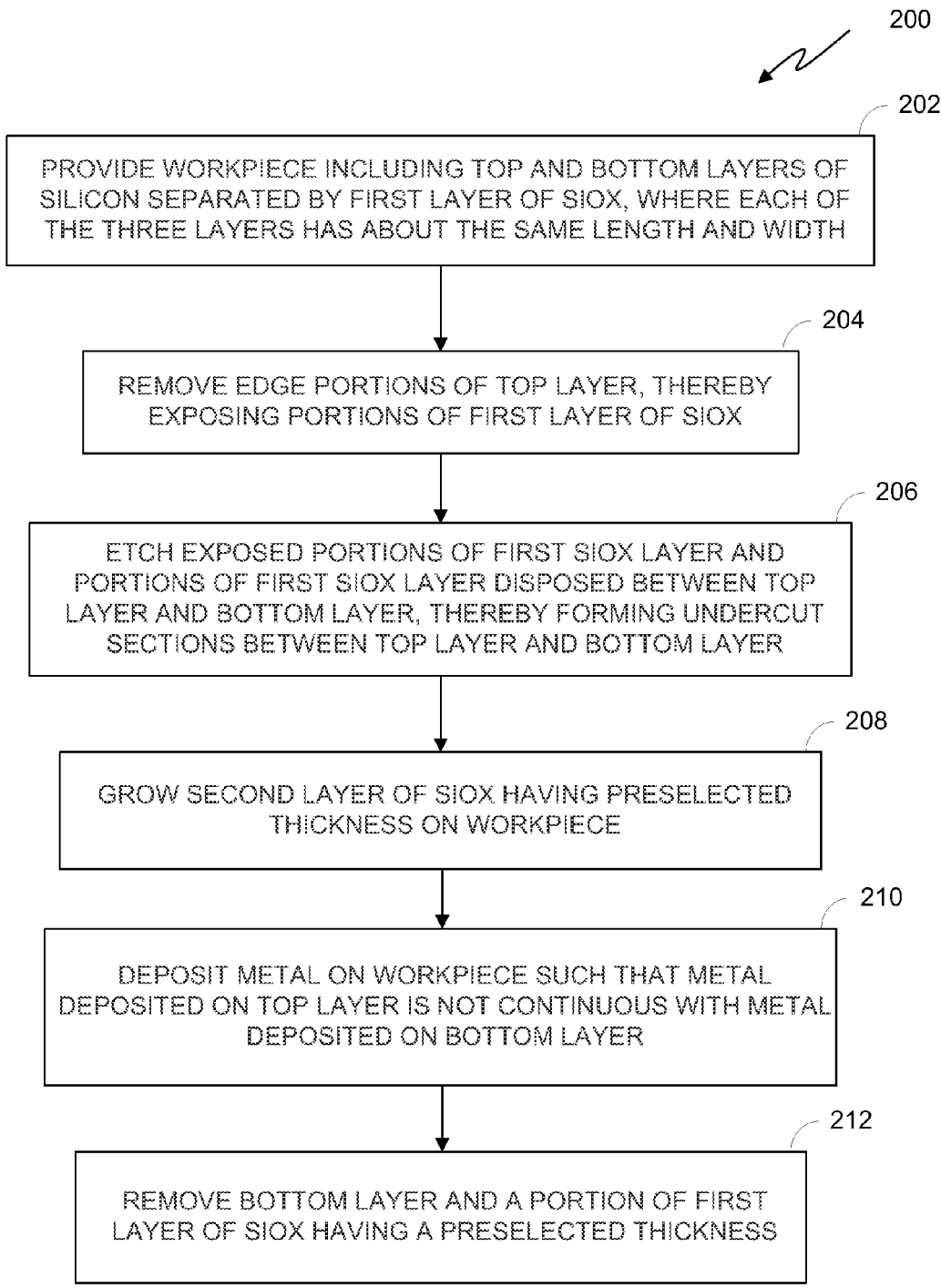
FIG. 2 illustrates a process for fabricating a component with precise dimension control in accordance with one embodiment of the invention.

FIG. 2 illustrates a process 200 for fabricating a component with precise dimension control din accordance with one embodiment of the invention. In several embodiments, the process 200 can be used in conjunction with the workpiece/ component 100 illustrated in FIGs. 1a-1j. The process first provides (202) a workpiece consisting of a top layer of silicon and a bottom layer of silicon separated by a first layer of SiOx, where each of the three layers has about the same length and width. The process then removes (204) edge portions of the top layer, thereby exposing portions of the first layer of SiOx. The process then etches (206) the exposed portions of the first SiOx layer and portions of the first SiOx layer disposed between the top layer and the bottom layer, thereby forming undercut sections between the top layer and the bottom layer.

The process grows (208) a second layer of SiOx having a preselected thickness on the workpiece. The process deposits (210) metal on the workpiece such that the metal deposited on the top layer is not continuous with the metal deposited on the bottom layer. In several embodiments, the process deposits the metal on the top and side surfaces of the top layer and inadvertently on the bottom layer as a consequence of the side surface deposition. However, the metal deposited on the top layer is not continuous with the metal deposited on the bottom layer. As a result, beneficial gaps are formed between the metal on the top layer and the metal inadvertently deposited on the bottom layer. The process then removes (212) the bottom layer and a portion of the first layer of SiOx having a preselected thickness.

In some embodiments, a carrier substrate is attached to the top surface of the top layer prior to removing the bottom layer to facilitate holding and securing the workpiece during the removal of the bottom layer. In such case, once the process has removed the bottom layer and the portions of the SiOx layers, the carrier can be removed. In several embodiments, once the component fabrication process is complete, the workpiece is used as a sub-mount for a read/write head in an EAMR application. In such case, the sub-mount can be used to bond a laser and a slider for a disk drive.

In one embodiment, the process can perform the sequence of actions in a different order. In another embodiment, the process can skip one or more of the actions. In other embodiments, one or more of the actions are performed simultaneously. In some embodiments, additional actions can be performed.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A method for fabricating silicon components with precise dimension control, the process comprising:
   providing a workpiece comprising a top layer of silicon and a bottom layer of silicon separated by a first layer of SiOx, where each of the three layers has about a same length and a same width;
   removing edge portions of the top layer, thereby exposing portions of the first layer of SiOx;
   etching the exposed portions of the first SiOx layer and portions of the first SiOx layer disposed between the top layer and the bottom layer, thereby forming undercut sections between the top layer and the bottom layer;
   growing a second layer of SiOx having a preselected thickness on the workpiece;
   depositing a metal on the workpiece such that the metal deposited on the top layer is not continuous with the metal deposited on the bottom layer; and
   removing the bottom layer and a portion of the first layer of SiOx having a preselected thickness.

2. The method of claim 1, wherein the removing the bottom layer and the portion of the first layer of SiOx having a preselected thickness comprises:
   removing a portion of the bottom layer such that a preselected thickness of the bottom layer remains;
   etching the preselected thickness of the bottom layer; and
   removing the second layer of SiOx and the portion of the first layer of SiOx such that the preselected thickness of the removed first layer portion of SiOx is about equal to the preselected thickness of the second layer of SiOx.

3. The method of claim 2, wherein the removing the portion of the bottom layer such that the preselected thickness of the bottom layer remains comprises grinding away a portion of the bottom layer.

4. The method of claim 3, wherein the removing the portion of the bottom layer such that the preselected thickness of the bottom layer remains further comprises lapping a portion of the bottom layer.

5. The method of claim 2, wherein the etching the preselected thickness of the bottom layer comprises performing reactive ion etching on the bottom layer.

6. The method of claim 2, wherein the removing the second layer of SiOx and the portion of the first layer of SiOx such that the preselected thickness of the removed first layer portion of SiOx is about equal to the preselected thickness of the second layer of SiOx comprises sputtering a gas on the second layer of SiOx and the first layer of SiOx.

7. The method of claim 6, wherein the gas comprises Ar.

8. The method of claim 2, wherein the removing the second layer of SiOx and the portion of the first layer of SiOx such that the preselected thickness of the removed first layer portion of SiOx is about equal to the preselected thickness of the second layer of SiOx comprises wet etching the second layer of SiOx and the first layer of SiOx.

9. The method of claim 1, further comprising:
   bonding the workpiece to a laser; and
   bonding the workpiece to a slider.

10. The method of claim 1, wherein the removing edge portions of the top layer comprises performing reactive ion etching to remove the edge portions, wherein the edge portions extend to the first layer of SiOx.

11. The method of claim 1, wherein the etching the exposed portions of the first SiOx layer and the portions of the first SiOx layer disposed between the top layer and the bottom layer, thereby forming the undercut sections between the top layer and the bottom layer, comprises acid etching the exposed portions of the first SiOx layer and the portions of the first SiOx layer disposed between the top layer and the bottom layer.

12. The method of claim 11, wherein the acid comprises hydrofluoric acid.

13. The method of claim 1, wherein the growing the second layer of SiOx having the preselected thickness on the workpiece comprises using a process to grow the second layer of SiOx, the process selected from the group consisting of a thermal oxidation process and a chemical vapor deposition process.

14. The method of claim 1, wherein the depositing the metal on the workpiece such that the metal deposited on the top layer is not continuous with the metal deposited on the bottom layer comprises:
   depositing the metal on a top surface of the top layer; and
   depositing the metal on side surfaces of the top layer, wherein at least some of the metal is deposited on a portion of the bottom layer,
   wherein a gap exists between the metal on the side surfaces of the top layer and the metal on the bottom layer.

15. The method of claim 14, wherein the depositing the metal on the side surfaces of the top layer comprises depositing the metal at an angle of about 45 degrees.

16. The method of claim 1, wherein the metal comprises one or more materials selected from the group consisting of Au, Ti, Ta, Ni, Pt, Cu, Cr and solder alloys.

17. The method of claim 16, wherein the solder alloys comprises one or more materials selected from the group consisting of In, Sn, and Ag.

18. The method of claim 1, wherein the depositing the metal on the workpiece such that the metal deposited on the top layer is not continuous with the metal deposited on the bottom layer comprises using a deposition process selected from the group consisting of a sputtering process and an evaporation process.

19. The method of claim 1, wherein the removing the bottom layer and the portion of the first layer of SiOx having the preselected thickness comprises:
    attaching the top layer to a carrier substrate;
    removing the bottom layer and the portion of the first layer of SiOx having the preselected thickness; and
    removing the carrier substrate.

20. The method of claim 19, wherein the attaching the top layer to the carrier substrate comprises positioning an adhesive material between the top layer and the carrier substrate.

21. The method of claim 20, wherein the adhesive material comprises a material selected from the group consisting of adhesive tape, adhesive wax, and a thermosetting polymer.

* * * * *